United States Patent [19]

Ishihara

[11] Patent Number: 5,667,597
[45] Date of Patent: Sep. 16, 1997

[54] POLYCRYSTALLINE SILICON SEMICONDUCTOR HAVING AN AMORPHOUS SILICON BUFFER LAYER

[75] Inventor: Shunichi Ishihara, Ikoma, Japan

[73] Assignee: Canon Kabushiki Kaisha, Tokyo, Japan

[21] Appl. No.: 406,486

[22] Filed: Mar. 20, 1995

[30] Foreign Application Priority Data

Mar. 22, 1994 [JP] Japan .................... 6-050845

[51] Int. Cl.$^6$ .............. H01L 31/06; H01L 31/0368; H01L 31/0392
[52] U.S. Cl. .............. 136/258; 257/49; 257/431; 257/458; 257/461
[58] Field of Search .............. 136/258 PC; 257/49, 257/53, 431, 458, 461

[56] References Cited

U.S. PATENT DOCUMENTS 5,238,879   8/1993   Plaettner .................... 437/233
5,246,886   9/1993   Sakai et al. ................ 437/228

*Primary Examiner*—Aaron Weisstuch
*Attorney, Agent, or Firm*—Fitzpatrick, Cella, Harper & Scinto

[57] ABSTRACT

A defect-free semiconductor device having a stacked layer structure formed on a substrate made of a material different from crystalline silicon, said stacked layer structure comprising an amorphous silicon layer on said substrate as a buffer layer and a polycrystalline silicon semiconductor active layer with a multilayered structure disposed on said amorphous silicon layer, said multilayered structure having at least a first polycrystalline silicon layer in non-junction forming contact with said amorphous silicon layer and a second polycrystalline silicon layer having a conductivity type opposite the conductivity type of said first polycrystalline silicon layer.

13 Claims, 3 Drawing Sheets

POLYCRYSTALLINE SILICON SEMICONDUCTOR HAVING AN AMORPHOUS SILICON BUFFER LAYER

BACKGROUND OF THE INVENTION

1. Field of the Invention

The present invention relates to an improved, defectless polycrystalline silicon semiconductor. More particularly, the present invention relates to an improved semiconductor having a stacked structure comprising a multilayered polycrystalline silicon semiconductor active layer disposed on an amorphous silicon buffer layer, which is free of defects and excelling in photoelectric conversion characteristics. The present invention includes a process for the production of said semiconductor.

2. Related Background Art

In recent years, polycrystalline silicon materials have received much public attention because they have advantages such that they have a practically acceptable electroconductivity and exhibit practically acceptable photoelectric conversion characteristics, and they can be produced at a lower production cost than that of single crystal silicon materials. Particularly, public attention has been focused on their application in the production of semiconductor devices. In fact, there have been proposed various semiconductor devices using such polycrystalline silicon materials, such as thin film transistors (hereinafter referred to as TFT), photosensor, photosensors (including photoelectric conversion elements), and photovoltaic devices (including solar cells).

Now, as for such a solar cell as a semiconductor device in which a polycrystalline silicon material is used (solar cells in which a polycrystalline silicon material is used will be hereinafter referred to as "polycrystal Si solar cell"), it is usually produced in the following manner. That is, high purity powder silicon or silicon particles are subjected to heat fusion in a mold, followed by cooling, to thereby obtain a polycrystalline silicon ingot. The resultant ingot is taken out from the mold, and sliced to obtain a plate-shaped member of a given thickness, followed by polishing, to thereby obtain a polycrystalline silicon wafer. As for the polycrystalline silicon wafer thus obtained, a pn junction is formed by diffusing dopant impurities thereinto. On the resultant wafer, a collecting electrode is formed, for instance, by means of the screen printing technique, followed by forming a reflection preventive layer. Thus, there is obtained a polycrystal Si solar cell.

According to this process, it is difficult to make the resulting polycrystal Si solar cell to be of 0.3 mm thickness or less by using such a polycrystalline silicon plate sliced from the ingot as above described. Hence, the resulting polycrystal Si solar cell unavoidably has a semiconductor active layer having a thickness that is significantly greater than that required for a semiconductor active layer of a thin film solar cell which absorbs light for photoelectric conversion, whereby there cannot be attained effective utilization of the polycrystalline silicon material. This problem eventually influences the production cost, resulting in making the polycrystalline Si solar cell costly.

The above problem in the conventional process for making a polycrystal Si solar cell apparently depends on the step of slicing an ingot and the step of polishing a member sliced from the ingot.

In order to eliminate the above problem, there have been proposed various processes for producing a polycrystal Si solar cell by forming a semiconductor active layer comprising a polycrystalline silicon thin film on a substrate made of glass or a metal such as stainless steel by an appropriate film-forming technique. The film-forming techniques include forming a polycrystalline silicon thin film directly on a glass or metal substrate by CVD, plasma CVD, or a liquid phase deposition process and forming a polycrystalline silicon thin film by first forming an amorphous silicon film or a polycrystalline silicon film of a small particle size (hereinafter referred to as small particle polycrystalline silicon film) by CVD, plasma CVD, vacuum evaporation, or a sputtering process, and subjecting said amorphous silicon film or small particle polycrystalline film to fusion or solid-phase growth treatment using laser beams or infrared rays to thereby form a polycrystalline silicon thin film. These methods are advantageous in that neither the foregoing ingot-slicing step nor the foregoing polishing step are necessary.

However, in any of these methods, there are problems in that the temperature required for the formation of a polycrystalline silicon thin film is significantly higher than room temperature and because of this, when a polycrystalline silicon thin film is formed on a glass or metal substrate which is different from the polycrystalline silicon thin film in terms of physical properties, particularly, the coefficient of thermal expansion and the coated substrate is cooled to room temperature, there is a tendency distortion to occur at the interface between the two members involved to cause defects in the polycrystalline thin film, wherein such defects prevent carriers from moving and they act as recombination centers for the carrier. Because of this, in the case of a solar cell having such a polycrystalline silicon thin film as the semiconductor active layer, solar cells with a desirable photoelectric conversion efficiency cannot be attained.

SUMMARY OF THE INVENTION

The principal object of the present invention is to eliminate the foregoing problems in the prior art and to provide an improved, defect-less polycrystalline silicon semiconductor excelling in semiconductor characteristics.

Another object of the present invention is to provide an improved, defect-less semiconductor device having a stacked layer structure on a substrate made of a material different from crystalline silicon, said stacked layer structure comprising a doped amorphous silicon layer on said substrate and a polycrystalline silicon semiconductor active layer with a multilayered structure disposed on said amorphous silicon layer, said multilayered structure having a doped polycrystalline silicon layer which is in contact with said amorphous silicon layer without forming a junction therewith.

A further object of the present invention is to provide a semiconductor device having a stacked layer structure on a substrate made of a material different from crystalline silicon, said stacked layer structure comprising a doped amorphous silicon layer disposed on said substrate and a doped polycrystalline silicon layer stacked in contact with said amorphous silicon layer without forming a junction therewith, said polycrystalline silicon layer being one formed by alternately repeating (a) a step of depositing a film and (b) a step of subjecting said film to $H_2$ gas plasma treatment, said polycrystalline film being free of occurrence of distortion caused by the foregoing problems found in the prior art, having excellent photoelectric conversion characteristics, and which can be mass-produced at a reduced production cost.

A further object of the present invention is to provide a semiconductor device having a semiconductor active layer comprising a stacked layer structure disposed on a substrate made of a material different from crystalline silicon, said stacked layer structure comprising a doped amorphous silicon layer as a buffer layer disposed on said substrate and a multilayered polycrystalline silicon semiconductor active layer including a doped polycrystalline semiconductor layer stacked on said amorphous silicon layer without forming a junction therewith, said semiconductor device being free of distortion caused by the foregoing problems found in the prior art, excellent in photoelectric conversion characteristics, and which can be mass-produced at a reduced production cost.

A further object of the present invention is to provide a semiconductor device having a semiconductor active layer comprising a stacked layer structure disposed on a substrate made of a material different from crystalline silicon, said stacked layer structure comprising a doped amorphous silicon layer as a buffer layer disposed on said substrate and a multilayered polycrystalline silicon semiconductor active layer including a doped polycrystalline semiconductor layer stacked on said amorphous silicon layer without forming a junction therewith, said polycrystalline silicon semiconductor active layer being formed by alternately repeating (a) a step of depositing a film and (b) a step of subjecting said film to $H_2$ gas plasma treatment, said semiconductor device being free of occurrence of distortion caused by the foregoing problems found in the prior art, having excellent photoelectric conversion characteristics, and which can be mass-produced at a reduced production cost.

DESCRIPTION OF THE INVENTION AND PREFERRED EMBODIMENTS

The present invention has been accomplished as a result of extensive studies by the present inventor in order to eliminate the foregoing problems in the prior art and in order to attain the above objects.

The present invention will be described with reference to a solar cell as a typical example of a semiconductor device according to the present invention.

Figure 1:
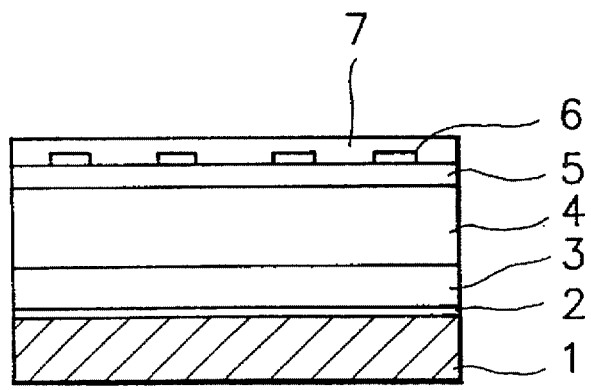
FIG. 1 is a schematic cross-sectional view illustrating a polycrystalline silicon solar cell as an example of a polycrystalline silicon semiconductor device according to the present invention.

FIG. 1 is a schematic cross-sectional view illustrating the constitution of a solar cell. The solar cell shown in FIG. 1 comprises a substrate 1, a metal layer 2 disposed on the substrate, a buffer layer 3 comprising an amorphous silicon film disposed on the metal layer 2, a semiconductor active layer having a stacked structure comprising a first polycrystalline silicon layer 4 and a second polycrystalline silicon layer 5 stacked in the named order on the buffer layer 3 (this semiconductor active layer will be hereinafter referred to as "polycrystalline silicon semiconductor active layer"), said first polycrystalline silicon layer 4 comprising a polycrystalline silicon film of a given conductivity type and said second polycrystalline silicon layer 5 comprising a polycrystalline silicon film of a conductivity type opposite to the conductivity type of the polycrystalline silicon film 4, a collecting electrode 6 disposed on the polycrystalline silicon semiconductor active layer, and an anti-reflection layer 7 disposed so as to cover the collecting electrode 6.

Description will now be made of each constituent of the solar cell.

Substrate

The substrate 1 serves as a support for the stacked structure of the solar cell. The substrate may be electroconductive or electrically insulating. The electroconductive substrate can include, for example, plate or film-like members of metals, such as Ni, Cr, Al, Cr, Mo, Au, Ir, Nb, Ag, etc. and alloys of these metals, such as stainless steel and Ni—Cr alloy. The electrically insulating substrate can include, for example, films or sheets of inorganic materials such as glass, ceramics, etc. or synthetic resins such as polyester, polyethylene, polycarbonate, polyvinyl chloride, polystyrene, etc.

Metal Layer

The metal layer 2 is provided in the case where the substrate 1 is comprised of an electrically insulating material. The metal layer in this case serves as an electrode. The metal layer is formed on the electrically insulating material, and it may be composed of a material selected from the group consisting of Ni, Cr, Al, Mo, Pt, Ag, Cu, Au, $In_2O_3$, $SnO_2$, ITO, etc. The metal layer may be formed by a conventional vacuum deposition process such as vacuum evaporation or sputtering or by a conventional coating process or by a printing process.

The metal layer may be disposed also in the case where the substrate is comprised of an electroconductive material. The electroconductive substrate may be designed so as to serve also as an electrode.

In the case where it is desired for the electrode to be of a low resistivity or in the case where it is desired for the electrode to reflect light so that light absorption by the polycrystalline silicon semiconductor active layer is improved, it is possible to dispose a metal layer capable of serving as an electrode and also as a light reflection layer. The metal layer in this case may be composed of a metal having a low resistivity, such as Ag, Al, Cu, or the like and it may be of a single or stacked layer structure. The surface of such layer structure may be uneven for the purpose of facilitating light scattering.

Buffer Layer (or Amorphous Silicon Layer)

The amorphous silicon layer 3 (that is, the buffer layer) functions to buffer distortion which occurs due to heat. The amorphous silicon layer is designed to be low in electric resistance. For this purpose, the amorphous silicon layer is composed of an amorphous silicon material containing a large amount of a dopant impurity capable of providing n-type or p-type conductivity. In addition, in order to prevent the amorphous silicon layer from forming a junction with the polycrystalline silicon semiconductor active layer, the amorphous silicon layer contains a dopant impurity providing the same conductivity type as the dopant impurity contained in the polycrystalline silicon layer 4.

Hereafter, description will be made of the findings obtained by the present inventor.

When a polycrystalline silicon film is formed at a substrate temperature of higher than 500° C. on a substrate made of quartz glass or a metal having a thermal expansion coefficient which is different from the polycrystalline silicon film and the resultant is cooled to room temperature, there occurs a difference between the degree of contraction of the substrate and that of the polycrystalline silicon film due to a difference between their thermal expansion coefficients and this contraction difference causes a stress-strain at the interface between the substrate and the polycrystalline silicon film. Such stress-strain which occurs at the interface between the substrate and the polycrystalline silicon film causes defects in the polycrystalline silicon film and deteriorates the adhesion of the polycrystalline film to the substrate. When a solar cell having such a polycrystalline silicon film is prepared, such defects in the polycrystalline silicon film lead to a reduction in its photoelectric conversion efficiency and said adhesion deterioration leads to separation between the polycrystalline silicon film and the substrate.

The provision of the amorphous silicon buffer layer 3 eliminates the occurrence of the above problems.

Particularly, the amorphous silicon layer 3 has a thermal expansion coefficient which is approximately the same as that of polycrystalline silicon because the constituent elements of the former are essentially the same as those of the latter and, in addition, the structure of the former in terms of the short or middle range order is similar to that of the latter. In this connection, even if a stacked structure comprising a polycrystalline silicon layer formed on an amorphous silicon layer is exposed to temperature changes, there is substantially no tendency for the stacked structure to suffer from such distortion as above described, which occurs due to a difference between such two members as above described in terms of the thermal expansion coefficient. Thus, even when a polycrystalline silicon layer is formed on an amorphous silicon layer as a buffer layer at a high temperature and the polycrystalline silicon layer thus formed is cooled to room temperature, the resultant polycrystalline silicon layer is maintained in a stable state without suffering from defects.

Now, in the case where the foregoing amorphous silicon layer 3 is formed on a substrate made of glass or a metal, there is a difference in the thermal expansion coefficient between the substrate and the amorphous silicon layer. When the amorphous silicon layer is formed on the substrate at an elevated substrate temperature to obtain a stacked body comprising the amorphous silicon layer formed on the substrate and the resultant stacked body is cooled to room temperature, defects are liable to occur at the amorphous silicon layer due to said difference in thermal expansion coefficient between the two members. However, these defects do not cause any noticeable problem in a semiconductor device in terms of the device characteristics.

As for the reasons for this, there can be considered the following three factors. The first factor concerns the structural flexibility of the amorphous silicon layer. Particularly, the amorphous silicon layer has structural flexibility, wherein the bond angle and bond length of the silicon atoms in the amorphous silicon layer are capable of being changed to a certain extent depending upon the magnitude of the environmental stress. Because of this, when the amorphous silicon layer formed on the substrate at an elevated temperature is cooled, the silicon bonds in the amorphous silicon layer are rearranged to provide a stress relaxation effect.

The second factor concerns the substrate temperature at which the amorphous silicon film layer is formed. Particularly, the amorphous silicon film is usually formed at a substrate temperature of 200° to 300° C., which is lower than that at which the polycrystalline silicon film is formed and therefore, the temperature change when the amorphous silicon film formed is cooled to room temperature is smaller than that when the polycrystalline silicon film is cooled to room temperature. Therefore, the density of defects occurring at the amorphous silicon film due to the thermal expansion coefficient difference between the substrate and the amorphous silicon film is smaller in comparison with the case of the polycrystalline silicon film.

The third factor concerns the valence electron impurity (that is, the donor or acceptor impurity) contained in a large amount in the amorphous silicon layer as the buffer layer in order that the amorphous silicon layer has a low electric resistance, wherein the Fermi level is shifted to the conduction band side or valence electron band side in the band gap and defects are mostly occupied by majority charge carriers such that those defects hardly influence the charge conduction. Hence, if a certain defect should occur at the amorphous silicon layer, particularly upon changes in the temperature at which the amorphous silicon layer is treated, such defects can be disregarded in the preparation of a semiconductor device such as a solar cell.

Thus, particularly in the production of a solar cell having a semiconductor active layer composed of a polycrystalline silicon active layer which is cooled to room temperature, the provision of the amorphous silicon layer as the buffer layer results in effectively preventing occurrence of defects which reduce the solar cell characteristics and makes the resulting polycrystalline silicon solar cell substantially free of defects and to exhibit an improved photoelectric conversion efficiency.

The amorphous silicon layer is desired to have a thickness preferably of 50 Å or more, more preferably of 100 Å or more, most preferably 500 Å to 1 µm, in order that the amorphous silicon layer effectively functions as the buffer layer as desired.

It is also desired that the amorphous silicon buffer layer be as low as possible in terms of electrical resistance in order that it does not act as a series resistance during outputting of electric current. For this purpose, the resistivity and thickness of the amorphous silicon layer are selected so that the resistance value per unit area (cm$^2$) becomes 5 Ω or less.

Herein, if the resistance value per square centimeter of the amorphous silicon layer is represented by R (Ω), the following equation can be established between the resistivity ρ (Ω·cm) of the amorphous silicon layer and the thickness d(cm).

$$R(\Omega) = \frac{\rho(\Omega \cdot cm) \cdot d}{1(cm^2)} = \rho \cdot d$$

Therefore, in order that the amorphous silicon layer does not act as a series resistance during outputting of electric current, it is necessary for the amorphous silicon layer to be designed so as to satisfy the condition: ρ·d≦5.

In the case where the amorphous silicon layer satisfies the optimum conditions for it to function as a buffer layer: 500 Å or more in thickness and ρ·d≦5, so that it does not effectively act as a series resistance during output of electric current, the resistivity (ρ) of the amorphous silicon layer can be expressed by the equation: ρ≦10$^6$ Ω·cm. In a preferred embodiment, the amorphous silicon layer is made to have a resistivity of less than 10$^6$ Ω·cm.

The amorphous silicon layer may be formed by a conventional plasma CVD process wherein glow discharge is caused in a gas atmosphere composed of a film-forming raw material gas such as $SiH_4$, $Si_2H_6$, $SiF_4$, $Si_2F_6$, $SiH_2Cl_2$, $SiCl_4$, $SiH_2F_2$, etc. either singly or in combination with a dilution gas such as $H_2$ gas, Ar gas, He gas, or the like in a plasma discharge space. As the decomposition energy source, there can be illustrated RF, VHF, LF, or microwave power. As for the substrate temperature during formation of the amorphous silicon layer, it should be in the range of room temperature to 500° C. depending upon the other film-forming conditions employed.

Now, in the case where the amorphous silicon layer is positioned in a semiconductor device including a solar cell in which an electric current flows in the film thickness direction, the amorphous silicon layer is desired to be of such a small resistance that no negative influence on the semiconductor characteristics thereof occurs. This situation can be attained by incorporating a valence electron controlling impurity into the amorphous silicon layer to decrease the resistance thereof. The usable donor or acceptor impurities include group III elements of the periodic table, such as Ga, In, Tl, B, Al and the like, and group V elements of the periodic table, such as N, P, As, Sb, Bi and the like.

The incorporation of such impurity into the amorphous silicon layer can be conducted by a conventional technique such as diffusion, ion implantation, and the like. In addition, the incorporation of such impurity into the amorphous silicon layer may be conducted upon the formation thereof by the plasma CVD process, wherein a raw material gas containing a desired impurity is introduced into the plasma discharge space together with the foregoing film-forming raw material gas. Specific examples of such raw material gas capable of supplying a desired impurity are $B_2H_6$, $BF_3$, $B_4H_{10}$, $PH_3$, $P_2H_4$, $PF_3$, $PF_5$, $SbH_3$, $BiH_3$, $AsH_3$, $NH_3$, $HN_3$, $N_2H_4$, and the like. According to this method, a dopant impurity can be effectively incorporated into an amorphous silicon film during the formation thereof. Thus, this dopant impurity incorporation method is more advantageous in comparison with other dopant impurity incorporation methods in terms of efficiency.

Semiconductor Active Layer

As above described, the semiconductor active layer (that is, the polycrystalline silicon semiconductor active layer) comprises a first polycrystalline silicon layer 4 of a given conductivity type and a second polycrystalline silicon layer 5 of a conductivity type opposite to the conductivity type of the polycrystalline silicon layer 4. In the following, description will be made of each of the first and second polycrystalline silicon layers 4 and 5.

First Polycrystalline Silicon Layer

The first polycrystalline silicon layer 4 performs power generation by absorbing light and thereby generating charge carriers. The first polycrystalline silicon layer is required to have a thickness sufficient to sufficiently absorb light which impinges thereon. However, in the case where the first polycrystalline silicon layer is excessively thick, there are such disadvantages as will be described in the following. That is, the distance the carriers must travel is accordingly increased and as a result, a reduction is caused in the electric current and voltage outputted to the external electric circuit. In addition, the period of time for the layer formation is increased, wherein the amount of a raw material used is increased, resulting in making the product costly.

The thickness of the first polycrystalline silicon layer 4 should be determined such that it exhibits its required function and that such disadvantages as above described do not occur.

Incidentally, in the case where the first polycrystalline silicon layer has a relationship with the metal layer 2 in terms of the light absorption efficiency of the first polycrystalline silicon layer by making the metal layer function also as a light reflection layer, the first polycrystalline silicon layer efficiently absorbs the incident light, even in the case where the first polycrystalline silicon layer is thin.

In any case, it is desired for the first polycrystalline silicon layer 4 to have a thickness in the range of 1 to 50 µm.

In a preferred embodiment, the first polycrystalline silicon layer 4 forms a p-n junction with the second polycrystalline silicon layer 5. In this case, the first polycrystalline silicon layer contains a donor or acceptor impurity element. Particularly, the first polycrystalline silicon layer 4 has a conductivity type which is opposite to that of the second polycrystalline silicon layer 5. In addition, the first polycrystalline silicon layer 4 does not form a junction with the amorphous silicon buffer layer 3 but rather an ohmic contact with the amorphous silicon layer.

The first polycrystalline silicon layer may be formed by means of a conventional polycrystalline film-forming process. Specific examples of such polycrystalline film-forming process are a CVD process wherein a raw material gas such as $SiH_4$, $SiCl_2H_2$, $Si_2F_6$, or $SiF_2H_2$ is decomposed on a substrate maintained at a high temperature to form a polycrystalline silicon film on said substrate, a process wherein plasma glow discharge is caused in a gas atmosphere composed of a raw material gas such as $SiH_4$ or $SiF_4$ greatly diluted with $H_2$ gas by applying a discharge power of RF, LF, VHF, or microwaves to cause the deposition of a polycrystalline silicon film on a substrate, and a liquid phase deposition process wherein Si is fused in a metal solvent of Sn, In, or Ga in a saturated state, a substrate is inserted into the metal solvent such that the surface of the substrate contacts the metal solvent, and the Si on the surface of the substrate is made to be in a supersaturated state while controlling the temperature of the metal solvent present on the surface of the substrate to be slightly lower than the temperature of the metal solvent before the insertion of the substrate thereinto, whereby a polycrystalline silicon film is formed on the substrate.

In any case, the substrate temperature upon forming the first polycrystalline silicon film should be determined such that the amorphous silicon layer previously formed as the buffer layer 3 does not become crystallized at the substrate temperature and thus disappear. In general, the substrate temperature is preferably less than 1000° C., more preferably 700° C. or less.

The incorporation of the foregoing impurity element into the first polycrystalline silicon layer can be conducted by a conventional technique such as diffusion, ion implantation, and the like. In addition the dopant impurity element can be introduced into the polycrystalline silicon film in a process wherein a raw material gas capable of supplying such dopant impurity element is mixed with a film-forming raw material gas at the time of forming said film.

The amount of the impurity element contained in the first polycrystalline silicon layer should be controlled so that it is not excessive, in order that a depletion layer extends in the entire region of the first polycrystalline silicon layer 4 when a p-n junction is formed with the second polycrystalline silicon layer 5. However, in the case where the amount of the impurity element contained in the first polycrystalline silicon layer is too low, there is caused an increase in the series resistance, resulting in a loss in the electric current outputted to the external circuit. In view of this, the amount of the impurity element to be contained in the first polycrystalline silicon layer 4 is controlled such that the first polycrystalline silicon layer has a resistivity of 0.1 to 100 Ω·cm.

Second Polycrystalline Silicon Layer

The second polycrystalline silicon layer 5 is desired to comprise a polycrystalline silicon film or a polycrystalline silicon carbide film.

The second polycrystalline layer 5 serves as a constituent of the semiconductor active layer. The second polycrystalline silicon layer 5 is stacked on the first polycrystalline silicon layer 4 while forming a p-n junction with said first polycrystalline silicon layer 4. For this purpose, the second polycrystalline silicon layer contains a dopant impurity element capable of making the second polycrystalline layer of a conductivity type opposite to that of the first polycrystalline silicon layer. The second polycrystalline silicon layer 5 may be formed in the same manner as the first polycrystalline silicon layer 4. The incorporation of the dopant impurity element into the second polycrystalline silicon layer may be also conducted in the same manner as in the case of the first polycrystalline silicon layer 4. As for the raw material capable of supplying the above impurity element, those impurity-supplying raw materials illustrated in the case of the first polycrystalline silicon layer may be used.

The second polycrystalline silicon layer is desired to be thin in order that light is sufficiently absorbed by the first polycrystalline silicon layer 4 to generate charge carriers. Specifically, the second polycrystalline silicon layer is made to have a thickness of preferably 2000 Å or less.

In order for the second polycrystalline silicon layer to form a p-n junction with the first polycrystalline silicon layer having a large open circuit voltage, it is necessary for the second polycrystalline silicon layer to contain a large amount of a desired donor or acceptor impurity element. In any case, it is important for the impurity element to be contained in the second polycrystalline silicon layer so that free electrons or holes are effectively produced and the Fermi level is sufficiently shifted toward the conduction band side or the valence electron band side. In general, the incorporation of a donor or acceptor impurity element in a large amount into the second polycrystalline silicon layer is conducted such that the second polycrystalline silicon layer has a resistivity of 1 Ω·cm or less.

Collecting Electrode

The collecting electrode 6 functions to output charge carriers collected in the second polycrystalline silicon layer 5 of the semiconductor active layer to an external circuit. The collecting electrode 6 is formed on the surface of the semiconductor active layer in the form of a grid-like or comb-like shape using a metal having a high conductivity, such as Ag, Al or Cu, by means of a conventional vacuum evaporation process or a conventional paste-coating process. Alternatively, the collecting electrode may be formed by fixing a metal wire or a metal wire coated by a conductive resin onto the surface of the semiconductor active layer.

In the case where light is impinged through the collecting electrode side, it is desired that the width of the collecting electrode be as narrow as possible and the interval thereof as wide as possible, in view of facilitating light incidence on the semiconductor active layer. However, in the case where the collecting electrode is too narrow or too wide, there is caused an increase in the series resistance, whereby the generated charge carriers cannot be efficiently outputted to the external circuit. In a preferred embodiment, the collecting electrode has a width of 0.02 to 1 mm and an interval of 1 mm to 5 cm.

However, in practice, the width and interval of the collecting electrode should be determined depending upon the surface resistance of the semiconductor active layer and the surface resistance of the anti-reflection layer 7.

Anti-Reflection Layer

The anti-reflection layer 7 has the purpose of facilitating efficient impingement of incident light into the semiconductor active layer. The anti-reflection layer is comprised of a metal oxide material such as $In_2O_3$, $SnO_2$, $TiO_2$, ZnO, ZrO, or ITO.

The anti-reflection layer has a thickness such that light reflection becomes a minimum, while taking into account the refractive index of the material used for the formation thereof.

In the case where the anti-reflection layer is formed of a material having a low resistivity and the surface resistance thereof is smaller than that of the semiconductor active layer, the collecting electrode 6 may be positioned on the anti-reflection layer 7.

Figure 2:
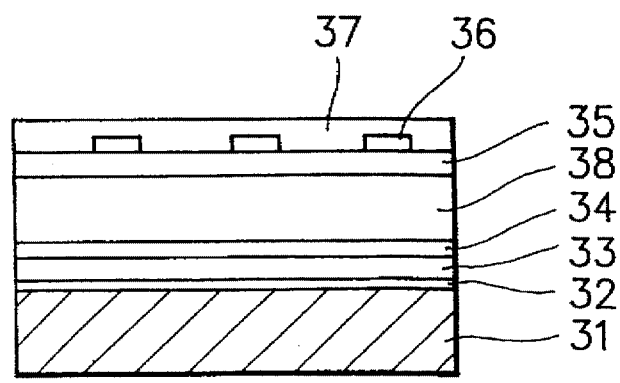
FIG. 2 is a schematic cross-sectional view illustrating another polycrystalline silicon solar cell as an example of a polycrystalline silicon semiconductor device according to the present invention.

Shown in FIG. 2 is another example of a solar cell according to the present invention. The solar cell shown in FIG. 2 is a modification of the solar cell shown in FIG. 1, in which an intrinsic polycrystalline silicon layer is interposed between the first and second polycrystalline silicon layers constituting the two-layered layered semiconductor active layer with a p-n junction shown in FIG. 1. Particularly, the configuration shown in FIG. 2 is distinguished from the configuration shown in FIG. 1 in that a three-layered semiconductor active layer with a p-i-n junction comprising a p- or n-type polycrystalline silicon layer, an i-type (intrinsic) polycrystalline semiconductor layer, and an n- or p-type polycrystalline semiconductor layer is employed.

In FIG. 2, reference numeral 31 indicates a substrate, reference numeral 32 a metal layer (or a reflection layer), reference numeral 33 a buffer layer comprising an amorphous silicon film, reference numeral 34 a first semiconductor layer comprising a p- or n-type polycrystalline silicon film, reference numeral 38 a second semiconductor layer comprising an i-type (intrinsic) polycrystalline silicon film, reference numeral 35 a third semiconductor layer comprising an n- or p-type polycrystalline silicon film, reference numeral 36 a collecting electrode, and reference numeral 37 an anti-reflection layer.

The solar cell shown in FIG. 2 is of the same configuration as the solar cell shown in FIG. 1, except for the i-type polycrystalline silicon layer 38. Thus, the constituents other than the i-type polycrystalline layer 38 are the same as those in the solar cell shown in FIG. 1.

The i-type polycrystalline silicon layer 38 may be formed by repeating the procedures of forming the foregoing first or second polycrystalline silicon layer in the solar cell shown FIG. 1, except for not using a donor or acceptor impurity element-supplying raw material gas.

The present invention will now be described in more detail with reference to the following examples, which are provided here for illustrative purposes only, and are not intended to limit the scope of the present invention.

EXAMPLE 1

A solar cell of the configuration shown in FIG. 1 was prepared.

Firstly, there was provided a stainless steel plate of 1 mm in thickness and 5 cm×5 cm in size as the substrate 1. The substrate was then cleaned using acetone and isopropyl alcohol, followed by drying.

The substrate thus treated was placed in a conventional electron beam evaporation chamber, wherein an about 500 Å thick Ag film was formed as the reflection layer 2 on the substrate under a pressure of less than $1.33 \times 10^{-4}$ Pa during film formation. The substrate 1 having the reflection layer formed thereon was taken out from the evaporation chamber, and it was transferred into a plasma CVD fabrication apparatus shown in FIG. 3, wherein it was positioned on a substrate holder 57.

Description will now be made of the plasma CVD fabrication apparatus shown in FIG. 3.

Figure 3:
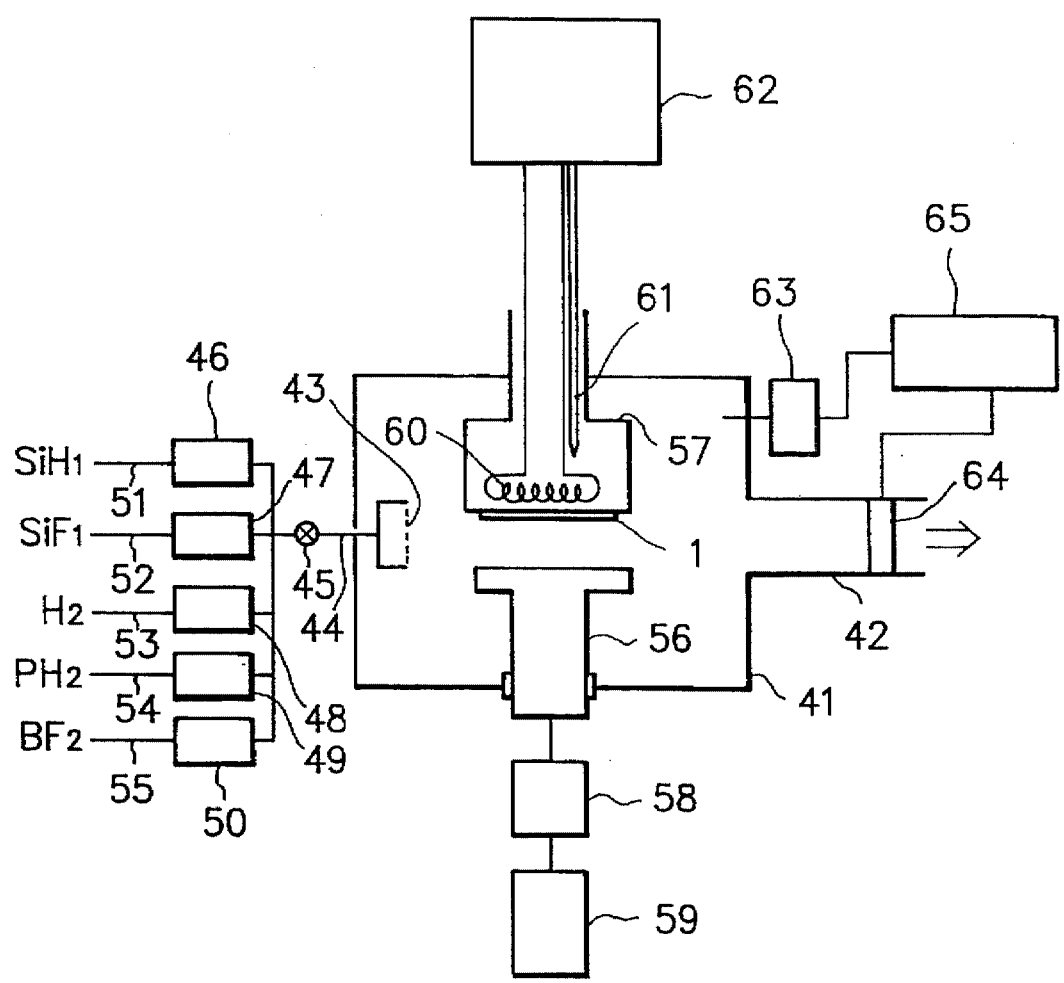
FIG. 3 is a schematic diagram illustrating a plasma CVD fabrication apparatus suitable for the production of a polycrystalline silicon semiconductor device according to the present invention.

In FIG. 3, reference numeral 41 indicates a deposition chamber. The deposition chamber 41 is provided with an exhaust pipe 42 for evacuating the inside thereof. The exhaust pipe 42 is connected through an exhaust valve 64 to a vacuum means comprising a turbo-molecular pump and a rotary pump (not shown). Reference numeral 43 indicates a gas introduction port for supplying into the deposition chamber 41 a raw material gas a gas feed pipe 44. The gas feed pipe 44 is provided with a valve 45 capable of being operated by compressed air. The valve 45 serves to prevent a raw material gas from entering into the deposition chamber when trouble occurs in the deposition chamber.

Mass flow controllers 46 to 50 are connected to the gas feed pipe 44.

Reference numeral 51 indicates a gas supply pipe for $SiH_4$ gas from a source containing $SiH_4$ gas (not shown). The gas supply pipe 51 is connected to the mass flow controller 46. Reference numeral 52 indicates a gas supply pipe for $SiF_4$ gas from a source containing $SiF_4$ gas (not shown). The gas supply pipe 52 is connected to the mass flow controller 47. Reference numeral 53 indicates a gas supply pipe for $H_2$ gas from a source containing $H_2$ gas (not shown). The gas supply pipe 53 is connected to the mass flow controller 48. Reference numeral 54 indicates a gas supply pipe for $PH_3$ gas diluted by $H_2$ gas to 5% from a source containing $PH_3/H_2$ gas (not shown). The gas supply pipe 54 is connected to the mass flow controller 49. Reference numeral 55 indicates a gas supply pipe for $BF_3$ gas diluted by $H_2$ gas to 5% from a source containing $BF_3/H_2$ gas (not shown). The gas supply pipe 55 is connected to the mass flow controller 50.

Reference numeral 56 indicates an electrode for generating a plasma. The electrode 56 is connected to a high frequency power source (13.56 MHz) 59 through a matching box 58. Reference numeral 57 indicates a substrate holder which is electrically grounded. The substrate holder 57 contains an electric heater 60 and a thermocouple 61 installed in the inside thereof. Reference numeral 62 indicates a temperature controller which is electrically connected to the electric heater 60 and the thermocouple 61. Reference numeral 1 indicates the foregoing substrate 1. The substrate 1 positioned on the substrate holder 57 can be maintained at a desired temperature by means of the electric heater 60, thermocouple 61 and temperature controller 62. Reference numeral 63 indicates a pressure gauge for monitoring the pressure in the inside of the deposition chamber. Reference numeral 65 indicates a pressure controlling mechanism which serves to control the gas pressure in the inside of the deposition chamber.

After the stainless steel plate as the substrate 1 was positioned on the substrate holder 57 as shown in FIG. 3, the deposition chamber 41 was evacuated to bring the inside to a vacuum of less than $1 \times 10^{-4}$ Pa. The substrate was then heated and maintained at 250° C. by means of the heater 60 while operating the temperature controller 62. Thereafter, $SiH_4$ gas and $PH_3$ gas diluted by $H_2$ gas to 5% (hereinafter referred to as $PH_3/H_2$ gas (=5%)) were introduced into the deposition chamber 41 through the gas feed pipe 44 and the gas introduction port 43 at respective flow rates of 30 sccm and 0.6 sccm while operating the mass flow controllers 46 and 49. The gas pressure in the inside of the deposition chamber 41 was then maintained at 13 Pa. Successively, the high frequency power source 59 was switched on to apply a high frequency power of 20 W (13.56 MHz) into the deposition chamber 41, whereby a plasma discharge was caused between the electrode 56 and the substrate holder 57. After 17 minutes, an about 1000 Å thick n-type amorphous silicon film doped with P (that is, an a-Si:H:P film) was formed on the substrate 1 as the buffer layer 3.

Separately, using an identical plasma CVD fabrication apparatus as that used in the above, the above film-forming procedures were repeated to form a 6000 Å thick silicon film doped with P on a glass plate as the substrate 1. The film thus obtained was found to have a dark conductivity of $8 \times 10^{-3}$ S/cm. The film was subjected to reflection electron diffraction. As a result, the deposited film was found to be amorphous.

Now, after the formation of the amorphous silicon film as the buffer layer 3, the inside of the deposition chamber 41 was sufficiently evacuated. The substrate was then heated to and maintained at 550° C. Then, $SiF_4$ gas, $H_2$ gas, and $PH_3/H_2$ gas (=5%) were introduced into the deposition chamber 41 through the gas feed pipe 44 and the gas introduction port 43 at respective flow rates of 100 sccm, 20 sccm, and 0.2 sccm while operating the mass flow controllers 47, 48, and 49. The gas pressure in the inside of the deposition chamber 41 was maintained at 50 Pa.

The high frequency power source 59 was then switched on to apply a high frequency power (13.56 MHz) of 350 W into the deposition chamber 41, whereby a plasma discharge was caused between the electrode 56 and the substrate holder 57. The $SiF_4$ gas and $PH_3/H_2$ gas were intermittently introduced into the deposition chamber 41 in a manner of alternately repeating a step (a) of introducing the $SiF_4$ gas and $PH_3/H_2$ gas into the deposition chamber together with the $H_2$ gas for 5 seconds and a step (b) of introducing neither the $SiF_4$ gas nor the $PH_3/H_2$ gas but only the $H_2$ gas into the deposition chamber for 5 seconds. The alternate repetition of the steps (a) and (b) was conducted for 3 hours, whereby an about 12 μm thick n-type polycrystalline silicon film doped with P as the first polycrystalline silicon layer 4 was formed on the amorphous silicon film as the buffer layer 3.

Separately, using an identical plasma CVD fabrication apparatus as that used in the above, the above n-type polycrystalline silicon film-forming procedures were repeated to form an about 12 μm thick silicon film doped with P on a glass plate as the substrate. The silicon film obtained was subjected to reflection electron diffraction and measurement of its dark resistivity. As a result, the silicon film was found to be a polycrystalline silicon film with a strongly oriented (110) phase, and of 5 Ω·cm dark resistivity.

After the formation of the first polycrystalline silicon layer 4, the inside of the deposition chamber 41 was sufficiently evacuated while maintaining the substrate at 550° C. Then, $SiF_4$ gas, $H_2$ gas and $BF_3$ gas diluted by $H_2$ gas to 5% (hereinafter referred to as $BF_3/H_2$ gas (=5%)) were introduced into the deposition chamber 41 through the gas feed pipe 44 and the gas introduction port 43 at respective flow rates of 20 sccm, 5 sccm and 0.4 sccm while operating the mass flow controllers 47, 48 and 50. The gas pressure in the inside of the deposition chamber 41 was maintained at 50 Pa. The high frequency power source 59 was then switched on to apply a high frequency (13.56 MHz) power of 100 W into the deposition chamber 41, whereby a plasma discharge was caused between the electrode 56 and the substrate holder 57. The $SiF_4$ gas and $BF_3/H_2$ gas were intermittently introduced into the deposition chamber 41 in a manner of alternately repeating a step (a) of introducing the $SiF_4$ gas and BF$_3$/H$_2$ gas into the deposition chamber together with the H$_2$ gas for 60 seconds and a step (b) of introducing neither the SiF$_4$ gas nor the BF$_3$/H$_2$ gas but only the H$_2$ gas into the deposition chamber for 60 seconds. The alternate repetition of the steps (a) and (b) was conducted three times, whereby an about 250 Å thick p-type polycrystalline silicon film doped with B as the second polycrystalline silicon layer 5 was formed on the n-type polycrystalline silicon film as the first polycrystalline silicon layer 4.

Separately, using an identical plasma CVD fabrication apparatus as that used in the above, the above p-type polycrystalline silicon film-forming procedures were repeated to form an about 5000 Å thick silicon film doped with B on a glass plate as the substrate. The silicon film obtained was subjected to reflection electron diffraction and measurement of its resistivity. As a result, the deposited silicon film was found to be a polycrystalline silicon film of 0.02 Ω·cm dark resistivity.

Thus, there was obtained a stacked product comprising an Ag film as the reflection layer 2, an n-type amorphous silicon film as the buffer layer 3, and a two-layered semiconductor active layer with a n-p junction comprising an n-type polycrystalline silicon film as the first polycrystalline silicon layer 4 and a p-type polycrystalline silicon film as the second polycrystalline silicon layer 5 disposed in the named order on a stainless steel plate as the substrate 1.

The stacked product thus obtained was taken out from the plasma CVD fabrication apparatus, and it was placed in a conventional electron beam evaporation apparatus, wherein a patterned mask was positioned on the surface thereof and a comb-shaped collecting electrode 6 having a three-layered structure of Cr/Ag/Cr and having a width of 0.1 mm and an interval of 5 mm was formed thereon. The resultant was taken out from the electron beam evaporation apparatus, and it was placed in a conventional sputtering apparatus, wherein an In$_2$O$_3$ target was sputtered in an oxygen gas atmosphere maintained at 10 Pa to form an about 650 Å thick indium oxide film as the anti-reflection layer 7 over the collecting electrode 6.

Thus, there was obtained a solar cell of the configuration shown in FIG. 1.

The above procedures of preparing a solar cell were repeated to obtain 11 solar cells in total (hereinafter referred to as solar cell sample 1).

One of the resultant solar cells was cut to obtain a plurality of specimens. One of the specimens was subjected to observation by way of electron diffraction. As a result, it was found that the amorphous silicon film as the buffer layer 3 was about 1000 Å thick.

COMPARATIVE EXAMPLE 1

The procedures of Example 1 were repeated, except that the formation of the n-type amorphous silicon film as the buffer layer 3 was not conducted, to thereby obtain 10 comparative solar cells (hereinafter referred to as "comparative solar cell sample 1").
Evaluation As for each of the solar cell sample 1 and the comparative solar cell sample 1, the I–V characteristics were examined using an AM 1.5 simulator wherein light of 100 mW/cm$^2$ was irradiated.

As a result, the average short circuit current of the 10 solar cells of the solar cell sample 1 was greater than that of the 10 solar cells of the comparative solar cell sample 1.

It also was found that each of the 10 solar cells of the solar cell sample 1 surpassed the 10 comparative solar cells of the comparative solar cell sample 1 in terms of fill-factor.

Further, it was found that the average photoelectric conversion efficiency of the 10 solar cells of the solar cell sample 1 is superior to that of the 10 solar cells of the comparative solar cell sample 1 by about 20%.

In addition, the solar cell samples 1 and the comparative solar cell samples 2 were subjected to irradiation of AM 1.5 light of 100 mW/cm$^2$ in intensity for about 100 hours but no light degradation was observed for any of them.

The procedures of Example 1 were repeated, except that the stainless steel plate as the substrate was replaced by a quartz plate, and the formation of each of the reflection layer, the collecting electrode, and the anti-reflection layer was not conducted, to thereby obtain a sample having an n-type amorphous silicon film, an n-type polycrystalline silicon film and a p-type polycrystalline silicon film stacked in the named order on the quartz plate. (This sample will be hereinafter referred to as "test sample A.")

Then, the procedures of Comparative Example 1 were repeated, except that the stainless steel plate as the substrate was replaced by a quartz plate, and the formation of each of the reflection layer, the collecting electrode and the anti-reflection layer was not conducted, to thereby obtain a comparative sample having an n-type polycrystalline silicon film and a p-type polycrystalline silicon film stacked in the named order on the quartz plate. (This sample will be hereinafter referred to as "comparative test sample A.")

Each of the test sample A and the comparative test sample A was subjected to etching treatment using an etching liquid comprising a mixture of 100 cc of a 50% HF solution and 50 cc of a 0.15 mol. % aqueous solution of potassium dichromate. Each test sample thus treated was placed in a scanning electron microscope, wherein the surface of the sample was observed with respect to the presence of defects. As a result, it was found that the comparative test sample A has a defect density which is greater by more than two digits than that of the test sample A.

EXAMPLE 2

A solar cell of the configuration shown in FIG. 2 was prepared.

Firstly, there was provided a stainless steel plate of 1 mm in thickness and 5 cm×5 cm in size as the substrate. The substrate was then cleaned using acetone and isopropyl alcohol, followed by drying.

The substrate thus treated was placed in a conventional electron beam evaporation chamber, wherein an about 500 Å thick Ag film was formed as the reflection layer 32 on the substrate under a pressure of less than 1.33 ×10$^{-4}$ Pa during film formation. The substrate having the reflection layer formed thereon was taken out from the evaporation chamber, and it was placed in the plasma CVD fabrication apparatus shown in FIG. 3, wherein it was positioned on a substrate holder 57.

After the stainless steel plate as the substrate was positioned on the substrate holder 57 as shown in FIG. 3, the deposition chamber 41 was evacuated to a pressure of less than 1×10$^{-4}$ Pa. The substrate was then heated to and maintained at 250° C. by means of the heater 60 while operating the temperature controller 62. Thereafter, SiH$_4$ gas and PH$_3$ gas diluted by H$_2$ gas to 5% (hereinafter referred to as PH$_3$/H$_2$ gas (=5%)) were introduced into the deposition chamber 41 through the gas feed pipe 44 and the gas introduction port 43 at respective flow rates of 30 sccm and 0.6 sccm while operating the mass flow controllers 46 and 49. The gas pressure in the inside of the deposition chamber 41 was then maintained at 13 Pa. The high frequency power source 59 was then switched on to apply a high frequency (13.56 MHz) power of 20 W into the deposition chamber 41, whereby a plasma discharge was caused between the electrode 56 and the substrate holder 57. After 17 minutes, an about 1000 Å thick n-type amorphous silicon film doped with P (that is, an a-Si:H:P film) was formed on the substrate as the buffer layer 33.

After the formation of the amorphous silicon film as the buffer layer 33, the inside of the deposition chamber 41 was vacuum-evacuated. The substrate was then heated to and maintained at 550° C. Then, $SiF_4$ gas, $H_2$ gas, and $PH_3/H_2$ gas (=5%) were introduced into the deposition chamber 41 through the gas feed pipe 44 and the gas introduction port 43 at respective flow rates of 20 sccm, 5 sccm, and 0.4 sccm while operating the mass flow controllers 47, 48, and 49. The gas pressure in the inside of the deposition chamber 41 was then maintained at 50 Pa. The high frequency power source 59 was then switched on to apply a high frequency (13.56 MHz) power of 100 W into the deposition chamber 41, whereby a plasma discharge was caused between the electrode 56 and the substrate holder 57. The $SiF^4$ gas and $PH_3/H_2$ gas were intermittently introduced into the deposition chamber 41 in a manner of alternately repeating a step (a) of introducing the $SiF_4$ gas and $PH_3/H_2$ gas into the deposition chamber together with the $H_2$ gas for 60 seconds and a step (b) of introducing neither the $SiF_4$ gas nor the $PH_3/H_2$ gas but only the $H_2$ gas into the deposition chamber for 60 seconds. The alternate repetition of the steps (a) and (b) was conducted 6 times, whereby an about 500 Å thick n-type polycrystalline silicon film doped with P was formed as the first polycrystalline silicon semiconductor layer 34 on the amorphous silicon film as the buffer layer 33.

After the formation of the n-type polycrystalline silicon film as the first polycrystalline silicon semiconductor layer 34, the inside of the deposition chamber 41 was vacuum-evacuated while maintaining the substrate at 550° C. Then, $SiF_4$ gas and $H_2$ gas were introduced into the deposition chamber 41 through the gas feed pipe 44 and the gas introduction port 43 at respective flow rates of 100 sccm and 20 sccm while operating the mass flow controllers 47 and 48. The gas pressure in the inside of the deposition chamber 41 was then maintained at 50 Pa. The high frequency power source 59 then was switched on to apply a high frequency (13.56 MHz) power of 350 W into the deposition chamber 41, whereby a plasma discharge was caused between the electrode 56 and the substrate holder 57. The $SiF_4$ gas was intermittently introduced into the deposition chamber 41 in a manner of alternately repeating a step (a) of introducing the $SiF_4$ gas into the deposition chamber together with the $H_2$ gas for 5 seconds and a step (b) of introducing no $SiF_4$ gas but only the $H_2$ gas into the deposition chamber for 5 seconds. The alternate repetition of the steps (a) and (b) was conducted to form an about 5000 Å thick i-type polycrystalline silicon film as the second polycrystalline silicon semiconductor layer 38 on the previously formed first polycrystalline silicon semiconductor layer 34.

Separately, using an identical plasma CVD fabrication apparatus as that of the plasma CVD fabrication apparatus used in the above, the above i-type polycrystalline silicon film-forming procedures were repeated to form an about 5000 Å thick silicon film on a glass plate as the substrate. The silicon film was subjected to reflection electron diffraction and measurement of its dark resistivity. As a result, the deposited silicon film was found to be polycrystalline, 0.01 $\Omega$·cm in dark resistivity.

After the formation of the second polycrystalline silicon semiconductor layer 38, the inside of the deposition chamber 41 was vacuum-evacuated while maintaining the substrate at 550° C. Then, $SiF_4$ gas, $H_2$ gas and $BF_3/H_2$ gas (=5%) were introduced into the deposition chamber 41 through the gas feed pipe 44 and the gas introduction port 43 at respective flow rates of 20 sccm, 5 sccm, and 0.4 sccm while operating the mass flow controllers 47, 48, and 50. The gas pressure in the inside of the deposition chamber 41 was then maintained at 50 Pa. The high frequency power source 59 then was switched on to apply a high frequency (13.56 MHz) power of 100 W into the deposition chamber 41, whereby a plasma discharge was caused between the electrode 56 and the substrate holder 57. The $SiF_4$ gas and $BF_3/H_2$ gas were intermittently introduced into the deposition chamber 41 in a manner of alternately repeating a step (a) of introducing the $SiF_4$ gas and $BF_3/H_2$ gas into the deposition chamber together with the $H_2$ gas for 60 seconds and a step (b) of introducing neither the $SiF_4$ gas nor the $BF_3/H_2$ gas but only the $H_2$ gas into the deposition chamber for 60 seconds. The alternate repetition of the steps (a) and (b) was conducted three times, whereby an about 250 Å thick p-type polycrystalline silicon film doped with B was formed as the third polycrystalline silicon semiconductor layer 35 on the i-type polycrystalline silicon film as the second polycrystalline silicon semiconductor layer 38.

Thus, there was obtained a stacked product comprising an Ag film as the reflection layer 32, an n-type amorphous silicon film as the buffer layer 33 and a three-layered semiconductor active layer with an n-i-p junction comprising an n-type polycrystalline silicon film as the first polycrystalline silicon semiconductor layer 34, an i-type polycrystalline silicon film as the second polycrystalline silicon semiconductor layer 38 and a p-type polycrystalline silicon film as the third polycrystalline silicon layer 35 disposed in the named order on a stainless steel plate as the substrate.

The stacked product thus obtained was taken out from the plasma CVD fabrication apparatus and placed in a conventional electron beam evaporation apparatus, wherein a patterned mask was positioned on the surface of the stacked product and a comb-shaped collecting electrode 36 having a three-layered structure of Cr/Ag/Cr and having a width of 0.1 mm and an interval of 5 mm was formed thereon. The resultant was taken out from the electron beam evaporation apparatus and placed in a conventional sputtering apparatus, wherein an $In_2O_3$ target was sputtered in an oxygen gas atmosphere maintained at 10 Pa to form an about 650 Å thick indium oxide film as the anti-reflection layer 37 over the collecting electrode 36.

Thus, there was obtained a solar cell of the configuration shown in FIG. 2.

The above procedures of preparing a solar cell were repeated to obtain 10 solar cells in total (hereinafter referred to as solar cell sample 2).

COMPARATIVE EXAMPLE 2

The procedures of Example 2 were repeated, except that the formation of the n-type amorphous silicon film as the buffer layer 33 was not conducted, to thereby obtain 10 comparative solar cells (hereinafter referred to as comparative solar cell sample 2).

Evaluation

The I–V characteristics of each of the solar cell sample 2 and the comparative solar cell sample 2 were examined using an AM 1.5 simulator wherein light of 100 mW/cm$^2$ was irradiated.

As a result, the average short circuit current of the 10 solar cells of the solar cell sample 2 was greater than that of the 10 solar cells of the comparative solar cell sample 2.

It was also found that each of the 10 solar cells of the solar cell sample 2 surpassed the 10 solar cells of the comparative solar cell sample 2 in terms of fill-factor.

Further, it was found that the average photoelectric conversion efficiency of the 10 solar cells of the solar cell sample 2 is superior to that of the 10 solar cells of the comparative solar cell sample 2 by about 15%.

In addition, the solar cell sample 2 and the comparative solar cell sample 2 were subjected to irradiation of AM 1.5 light of 100 mW/cm$^2$ in intensity for about 100 hours. No light degradation was observed for any of them.

EXAMPLE 3

A solar cell of the configuration shown in FIG. 1 was prepared.

Firstly, there was provided a quartz plate of 1 mm in thickness and 5 cm×5 cm in size as the substrate 1. The substrate was then cleaned using acetone and isopropyl alcohol, followed by drying.

The thus treated substrate was placed in a conventional electron beam evaporation chamber, wherein an about 1000 Å thick Ag film was formed as the reflection layer 2 on the substrate under a pressure of less than $1.33 \times 10^{-4}$ Pa during film formation.

In this embodiment, the reflection layer 2 thus formed on the substrate serves also as an electrode.

The substrate 1 having the reflection layer 2 formed thereon was taken out from the evaporation chamber, and it was placed in the plasma CVD fabrication apparatus shown in FIG. 3, wherein it was positioned on a substrate holder 57.

After the quartz plate as the substrate was positioned on the substrate holder 57 as shown in FIG. 3, the deposition chamber 41 was evacuated to a vacuum of less than $1 \times 10^{-4}$ Pa. The substrate was then heated to and maintained at 250° C. by means of the heater 60 while operating the temperature controller 62. Thereafter, SiH$_4$ gas and PH$_3$ gas diluted by H$_2$ gas to 5% (hereinafter referred to as PH$_3$/H$_2$ gas (=5%)) were introduced into the deposition chamber 41 through the gas feed pipe 44 and the gas introduction port 43 at respective flow rates of 35 sccm and 0.6 sccm while operating the mass flow controllers 46 and 49. The gas pressure in the inside of the deposition chamber 41 was then maintained at 13 Pa. The high frequency power source 59 was then switched on to apply a high frequency (13.56 MHz) power of 20 W into the deposition chamber 41, whereby a plasma discharge was caused between the electrode 56 and the substrate holder 57. After 90 minutes, an about 6000 Å thick n-type amorphous silicon film doped with P (that is, an a-Si:H:P film) was formed on the substrate as the buffer layer 3.

Separately, using an identical plasma CVD fabrication apparatus as that used in the above, the above film-forming procedures were repeated to form a 6000 Å thick silicon film doped with P on a quartz plate as the substrate. The film thus obtained was found to have a dark conductivity of $1.5 \times 10^{-2}$ S/cm. The film was subjected to reflection electron diffraction. As a result, the film was found to be amorphous.

Figure 4:
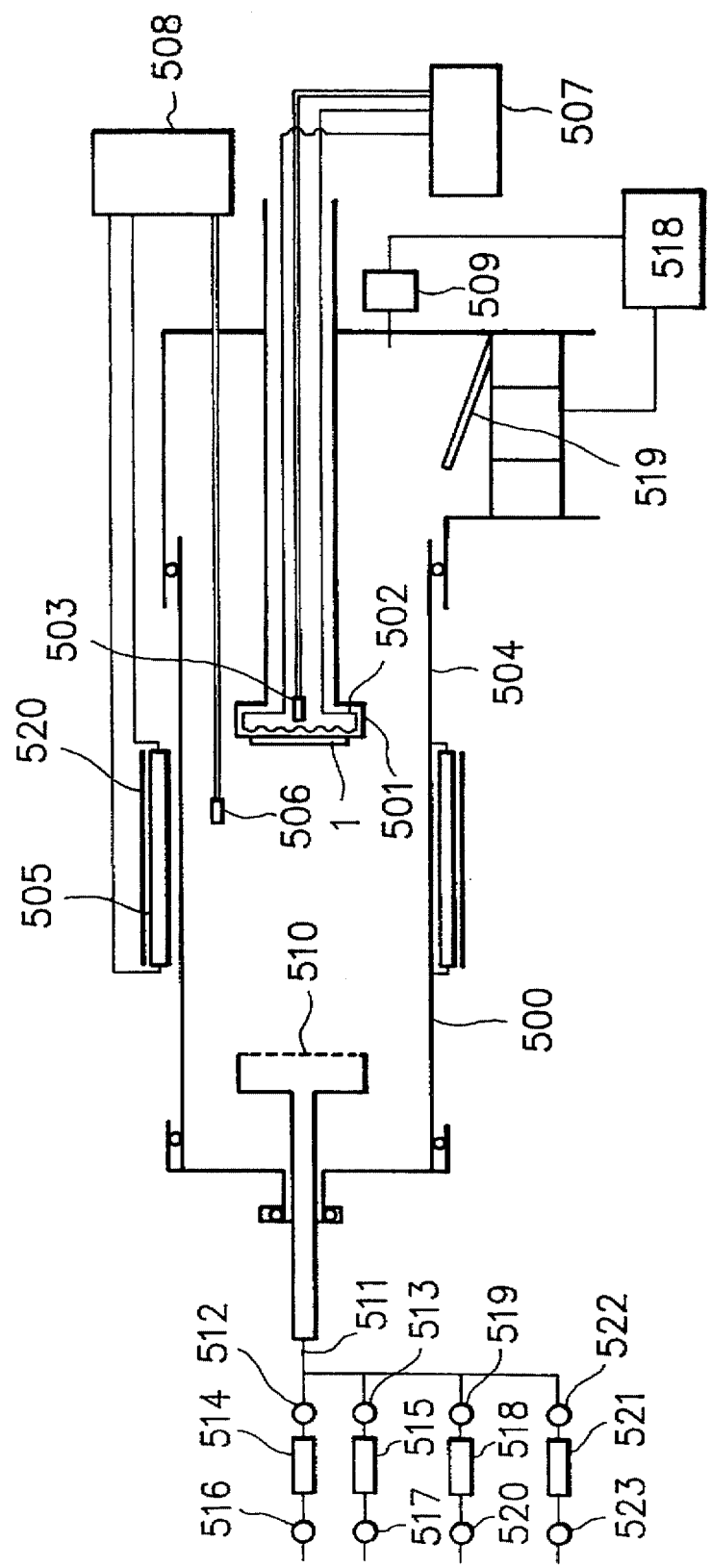
FIG. 4 is a schematic diagram illustrating a CVD fabrication apparatus suitable for producing a polycrystalline silicon semiconductor device according to the present invention.

Now, after the formation of the foregoing amorphous silicon-film as the buffer layer 3, the resultant was taken out from the plasma CVD fabrication apparatus of FIG. 3, and it was placed in a CVD fabrication apparatus shown in FIG. 4.

Description will now be made of the CVD fabrication apparatus shown in FIG. 4. In FIG. 4, reference numeral 500 generally indicates the CVD fabrication apparatus. Reference numeral 501 indicates a substrate holder for holding a substrate 1, reference numeral 502 an electric heater for heating the substrate 1, and reference numeral 503 a thermocouple for monitoring the temperature of the substrate. Reference numeral 507 indicates a temperature controller to which the electric heater 502 and the thermocouple 503 are electrically connected. The temperature controller 507 serves to maintain the substrate at a desired temperature. Reference numeral 504 indicates a quartz reaction chamber structured such that gas which flows inside can be heated by an infrared lamp 505. Reference numeral 506 indicates a thermocouple for monitoring the temperature in the inside of the reaction chamber 504. The infrared lamp 505 and the thermocouple 506 are electrically connected to a temperature controller 508 so that the inside temperature of the reaction chamber 504 can be controlled as desired. Reference numeral 520 indicates a plate for reflecting infrared rays from the infrared ray lamp 505 into the reaction chamber 504.

Reference numeral 510 indicates a gas introduction nozzle which is connected through a gas feed pipe 511 to a plurality of gas supply systems comprising a gas supply system for SiH$_4$ gas comprising a pipe provided with a valve 512, a mass flow controller 514, and a valve 516 connected to a source containing SiH$_4$ gas, a gas supply system for PH$_3$ gas diluted by H$_2$ gas to 5% (hereinafter referred to as PH$_3$/H$_2$ gas (=5%)) comprising a pipe provided with a valve 513, a mass flow controller 515, and a valve 517 connected to a source containing PH$_3$/H$_2$ gas, a gas supply system for B$_2$H$_6$ gas diluted by H$_2$ gas to 5% (hereinafter referred to as B$_2$H$_6$/H$_2$ gas (=5%)) comprising a pipe provided with a valve 519, a mass flow controller 518 and a valve 520 connected to a source containing B$_2$H$_6$/H$_2$ gas, and a gas supply system for H$_2$ gas comprising a pipe provided with a valve 522, a mass flow controller 521, and a valve 523 connected to a source containing H$_2$ gas.

In the CVD fabrication apparatus shown in FIG. 5, a selected raw material gas fed through the gas feed pipe 511 is introduced through the introduction nozzle 510 into the reaction chamber 504, wherein the raw material gas thus introduced is heated by infrared rays from the infrared lamp 505 whereby it is decomposed to produce film forming radicals, and these radicals collide with the surface of the substrate to cause the formation of a deposited film on the substrate. The remaining non-decomposed raw material gas is exhausted from the reaction chamber 504 through an exhaust system (not shown). Reference numeral 509 indicates a pressure gauge for measuring the gas pressure in the reaction chamber 504. Reference numeral 518 indicates a pressure controller which is electrically connected to the pressure gauge 509 and is also electrically connected to a pressure controlling valve mechanism 519. An electric signal from the pressure gauge 509 is inputted to the pressure controller 518 to output a control signal and the control signal is transmitted to the pressure controlling valve mechanism 519, wherein in accordance with the control signal, the pressure controlling valve mechanism controls the gas pressure in the inside of the reaction chamber 504.

After the formation of the foregoing amorphous silicon film as the buffer layer 3, the inside of the reaction chamber 504 was evacuated. The substrate was then heated to and maintained at 550° C. Then, SiF$_4$ gas, H$_2$ gas and PH$_3$/H$_2$ gas (=5%) were introduced into the reaction chamber 504 through the gas feed pipe 511 and the gas introduction nozzle 510 at respective flow rates of 50 sccm, 100 sccm, and 0.2 sccm. The gas pressure in the inside of the reaction chamber 504 was then controlled to and maintained at 100

Pa by means of the pressure controller 518. The infrared lamp 505 then was energized to apply infrared rays into the reaction chamber 504 so as to heat the raw material gases introduced into the reaction chamber 504 at 800° C., whereby the raw material gases were decomposed to produce radicals, which resulted in formation of a deposited film on the substrate maintained at 550° C. This film-forming operation was continued for 3 hours, whereby an about 15 μm thick n-type polycrystalline silicon film doped with P was formed as the first polycrystalline silicon semiconductor layer 4 on the n-type amorphous silicon film as the buffer layer.

Separately, using an identical plasma CVD fabrication apparatus as that used in the above, the above n-type polycrystalline silicon film-forming procedures were repeated to form an about 15 μm thick silicon film doped with P on a glass plate as the substrate. The silicon film obtained was subjected to reflection electron diffraction and measurement of its dark resistivity. As a result, the silicon film was found to be a polycrystalline silicon film with a strongly oriented (110) phase, with 4 Ω-cm dark resistivity.

After the formation of the first polycrystalline silicon semiconductor layer 4, the inside of the deposition chamber 504 was evacuated while maintaining the substrate at 550° C. Then, $SiF_4$ gas, $H_2$ gas and $BF_3$ gas diluted by $H_2$ gas to 5% ($BF_3/H_2$ gas (=5%)) were introduced into the reaction chamber 504 through the gas feed pipe 511 and the gas introduction nozzle 510 at respective flow rates of 10 sccm, 1 sccm, and 0.2 sccm. The gas pressure in the inside of the reaction chamber 504 was then controlled to and maintained at 100 Pa by means of the pressure controller 518. The infrared ray lamp 505 then was energized to apply infrared rays into the reaction chamber 504 so as to heat the raw material gases introduced into the reaction chamber 504 at 650° C., whereby the raw material gases were decomposed to produce radicals, which resulted in the formation of a film on the substrate maintained at 550° C. This film-forming operation was continued for 30 minutes, whereby an about 260 Å thick p-type polycrystalline silicon film doped with B was formed as the second polycrystalline silicon semiconductor layer 5 on the n-type polycrystalline silicon film 4.

Separately, using an identical CVD fabrication apparatus as that used in the above, the above p-type polycrystalline silicon film-forming procedures were repeated wherein film formation was conducted for 8 hours, thereby obtaining a specimen comprising a relatively thick silicon film doped with P formed on a quartz plate as the substrate. The silicon film specimen thus obtained was subjected to reflection electron diffraction and measurement of its dark resistivity. As a result, the deposited silicon film specimen was found to be polycrystalline, of 0.05 Ω-cm in dark resistivity.

There was obtained a stacked product comprising an Ag film as the reflection layer 2, an n-type amorphous silicon film as the buffer layer 3 and a two-layered semiconductor active layer with an n-p junction comprising an n-type polycrystalline silicon film as the first polycrystalline silicon semiconductor layer 4 and a p-type polycrystalline silicon film as the second polycrystalline silicon layer 5 disposed in the named order on a stainless steel plate as the substrate.

The stacked product thus obtained was taken out from the CVD fabrication apparatus and placed in a conventional electron beam evaporation apparatus, wherein a patterned mask was positioned on the surface of the stacked product and a comb-shaped collecting electrode 6 having a three-layered structure of Cr/Ag/Cr and having a width of 0.1 mm and an interval of 5 mm was formed thereon. The resultant was taken out from the electron beam evaporation apparatus, and it was placed in a conventional sputtering apparatus, wherein an $In_2O_3$ target was sputtered in an oxygen gas atmosphere maintained at 10 to form an about 650 Å thick indium oxide film as the anti-reflection layer 7 over the collecting electrode 6.

Thus, a solar cell of the configuration shown in FIG. 1 was obtained.

The above procedures of preparing a solar cell were repeated to obtain 10 solar cells in total (hereinafter referred to as "solar cell sample 3").

COMPARATIVE EXAMPLE 3

The procedures of Example 3 were repeated, except that the formation of the n-type amorphous silicon film as the buffer layer 3 was not conducted, to thereby obtain 10 comparative solar cells (hereinafter referred to as "comparative solar cell sample 3").

Evaluation

The I-V characteristics of each of the solar cell sample 3 and the comparative solar cell sample 3 were examined using an AM 1.5 simulator wherein light of 100 mW/cm$^2$ was irradiated.

As a result, the average short circuit current of the 10 solar cells of the solar cell sample 3 was greater than that of the 10 solar cells of the comparative solar cell sample 3.

It was also found that each of the 10 solar cells of the solar cell sample 3 surpassed the 10 solar cells of the comparative solar cell sample 3 in terms of fill-factor.

Further, it was found that the average photoelectric conversion efficiency of the 10 solar cells of the solar cell sample 3 is superior to that of the 10 solar cells of the comparative solar cell sample 3 by about 18%.

In addition, the solar cell sample 3 and the comparative solar cell sample 3 were subjected to irradiation of AM 1.5 light of 100 mW/cm$^2$ in intensity for about 100 hours. No light degradation was observed for any of them.

What is claimed is:

1. A semiconductor device having a stacked layer structure on a substrate made of a material different from crystalline silicon, said stacked layer structure comprising an amorphous silicon layer having an n- or p-type conductivity on said substrate as a buffer layer and a polycrystalline silicon semiconductor active layer with a multilayered structure disposed on said amorphous silicon layer, said multilayered structure having at least a first polycrystalline silicon layer in non-junction forming contact with said amorphous silicon layer and a second polycrystalline silicon layer having a conductivity type opposite to the conductivity type of said first polycrystalline silicon layer.

2. A semiconductor device according to claim 1, wherein said multilayered structure further comprises an intrinsic polycrystalline silicon layer interposed between said first polycrystalline silicon layer and said second polycrystalline silicon layer.

3. A semiconductor device according to claim 1, wherein the resistivity of said amorphous silicon layer is $10^6$ Ω-cm or less.

4. A semiconductor device according to claim 1, wherein said amorphous silicon layer has a thickness in the range of 50 Å to 1 μm.

5. A semiconductor according to claim 1, wherein said first polycrystalline silicon semiconductor layer has a thickness in the range of 1 to 50 μm.

6. A semiconductor according to claim 1, wherein said amorphous silicon layer contains a dopant element selected from the group consisting of P, As, and B.

7. A semiconductor device having a stacked layer structure on a substrate made of a material different from crystalline silicon and a collecting electrode disposed on said stacked layer structure, said stacked layer structure comprising an amorphous silicon layer having an n- or p-type conductivity on said substrate as a buffer layer and a polycrystalline silicon semiconductor active layer with a multilayered structure disposed on said amorphous silicon layer, said multilayered structure having at least a first polycrystalline silicon layer in non-junction forming contact with said amorphous silicon layer and a second polycrystalline silicon layer having a conductivity type opposite to the conductivity type of said first polycrystalline silicon layer.

8. A semiconductor device according to claim 7, wherein the multilayered structure further comprises an intrinsic polycrystalline silicon layer interposed between said first polycrystalline silicon layer and said second polycrystalline silicon layer.

9. A semiconductor device according to claim 7, wherein the resistivity of said amorphous silicon layer is $10^6$ Ω·cm or less.

10. A semiconductor device according to claim 7, wherein said amorphous silicon layer has a thickness in the range of 50 Å to 1 μm.

11. A semiconductor device according to claim 7, wherein said first polycrystalline silicon semiconductor layer has a thickness in the range of 1 to 50 μm.

12. A semiconductor device according to claim 7, wherein said amorphous silicon layer contains a dopant element selected from the group consisting of P, As, and B.

13. A semiconductor device according to claim 7, wherein said semiconductor device is a solar cell.

* * * * *